(12) United States Patent
Liu et al.

(10) Patent No.: US 8,081,883 B2
(45) Date of Patent: Dec. 20, 2011

(54) METHOD AND APPARATUS FOR COMPENSATING FOR OPTICAL CROSSTALK IN AN OPTICAL OUTPUT POWER FEEDBACK MONITORING SYSTEM OF A PARALLEL OPTICAL TRANSMITTER

(75) Inventors: Guobin Liu, San Luis Obispo, CA (US); Jianping Su, Sunnyvale, CA (US); An-Nien Chen, San Jose, CA (US); Poorya Saghari, San Jose, CA (US); Hui Xu, Santa Clara, CA (US)

(73) Assignee: Avago Technologies Fiber IP (Singapore) Pte. Ltd, Singapore (SG)

( * ) Notice: Subject to any disclaimer, the term of this patent is extended or adjusted under 35 U.S.C. 154(b) by 93 days.

(21) Appl. No.: 12/730,487

(22) Filed: Mar. 24, 2010

(65) Prior Publication Data
US 2011/0236028 A1    Sep. 29, 2011

(51) Int. Cl.
*H04B 10/04* (2006.01)
(52) U.S. Cl. ........ 398/195; 398/197; 398/192; 398/194; 398/137
(58) Field of Classification Search .................. 398/195, 398/197, 192, 194, 137, 162, 158, 159, 25, 398/140, 135
See application file for complete search history.

(56) References Cited

U.S. PATENT DOCUMENTS

| | | | |
|---|---|---|---|
| 5,319,438 A * | 6/1994 | Kiasaleh | 398/203 |
| 5,521,736 A * | 5/1996 | Swirhun et al. | 398/154 |
| 5,625,480 A * | 4/1997 | Swirhun et al. | 398/154 |
| 6,580,513 B2 * | 6/2003 | Akahoshi | 356/484 |
| 6,624,917 B1 * | 9/2003 | Paschal et al. | 398/187 |
| 6,671,079 B2 | 12/2003 | Fuller et al. | |
| 7,330,666 B1 | 2/2008 | Koley | |
| 7,593,645 B2 * | 9/2009 | Sicard et al. | 398/182 |
| 7,801,442 B2 * | 9/2010 | Wang et al. | 398/5 |
| 7,899,098 B2 * | 3/2011 | Robinson et al. | 372/38.02 |
| 2002/0118424 A1 * | 8/2002 | Miki et al. | 359/187 |
| 2008/0025732 A1 * | 1/2008 | Hattori | 398/194 |
| 2008/0187324 A1 | 8/2008 | Akiyama | |

* cited by examiner

*Primary Examiner* — Kenneth N Vanderpuye
*Assistant Examiner* — Hibret Woldekidan (57) ABSTRACT

A method and an apparatus are provided for use in a parallel optical transmitter or transceiver to compensate for variations in optical crosstalk in an optical output power monitoring system that are caused by lasers being enabled and/or disabled. In particular, the method and apparatus cause adjustments to be made to the reference value of each optical channel based on determinations of whether one or more lasers of the other optical channels have been disabled or enabled. By making these adjustments, the average optical output power level of each laser of each channel can be maintained at a desired or required level even if one or more of the lasers of one or more of the other channels is enabled or disabled.

19 Claims, 6 Drawing Sheets

METHOD AND APPARATUS FOR COMPENSATING FOR OPTICAL CROSSTALK IN AN OPTICAL OUTPUT POWER FEEDBACK MONITORING SYSTEM OF A PARALLEL OPTICAL TRANSMITTER

TECHNICAL FIELD OF THE INVENTION

The invention relates to parallel optical transmitters and transceivers. More particularly, the invention relates to compensating for optical crosstalk in an optical output power feedback monitoring system of a parallel optical transmitted or transceiver.

BACKGROUND OF THE INVENTION

In optical communications systems, lasers are used in optical transmitters and optical transceivers to convert electrical data signals into optical data signals, which are then transmitted over an optical waveguide, typically an optical fiber, to some intended destination, such as to an optical receiver or transceiver. Parallel optical transmitters and transceivers include multiple optical transmit channels, each of which has a respective laser for generating a respective optical data signal to be transmitted over the respective optical channel. In many parallel optical transmitters and transceivers, the output power level of at least one of the lasers is monitored by an optical output power feedback monitoring system that adjusts the modulation and/or bias currents of the lasers such that the average output power levels of the lasers are maintained at a desired or required level. Typically, the adjustments are made to cause the average output power levels of the lasers to be maintained at a predetermined, substantially constant level.

It is common practice in the optical communications industry to use a monitor photodiode to detect light output from a rear portion of the transmitter laser (or a portion of the output power reflected back through optical lenses) and to use this optical feedback to measure and control the average optical output power level of a laser. In general, the average transmitted output power level, $P_{AVG}$, of the laser can be controlled by controlling the bias current, $I_{BIAS}$, of the laser. Thus, if the optical feedback indicates that $P_{AVG}$ has fallen below the required level, increasing $I_{BIAS}$ by an appropriate amount will raise $P_{AVG}$ to the required level. Similarly, if the optical feedback indicates that $P_{AVG}$ has risen above the required level, decreasing $I_{BIAS}$ by an appropriate amount will lower $P_{AVG}$ to the required level.

Figure 1:
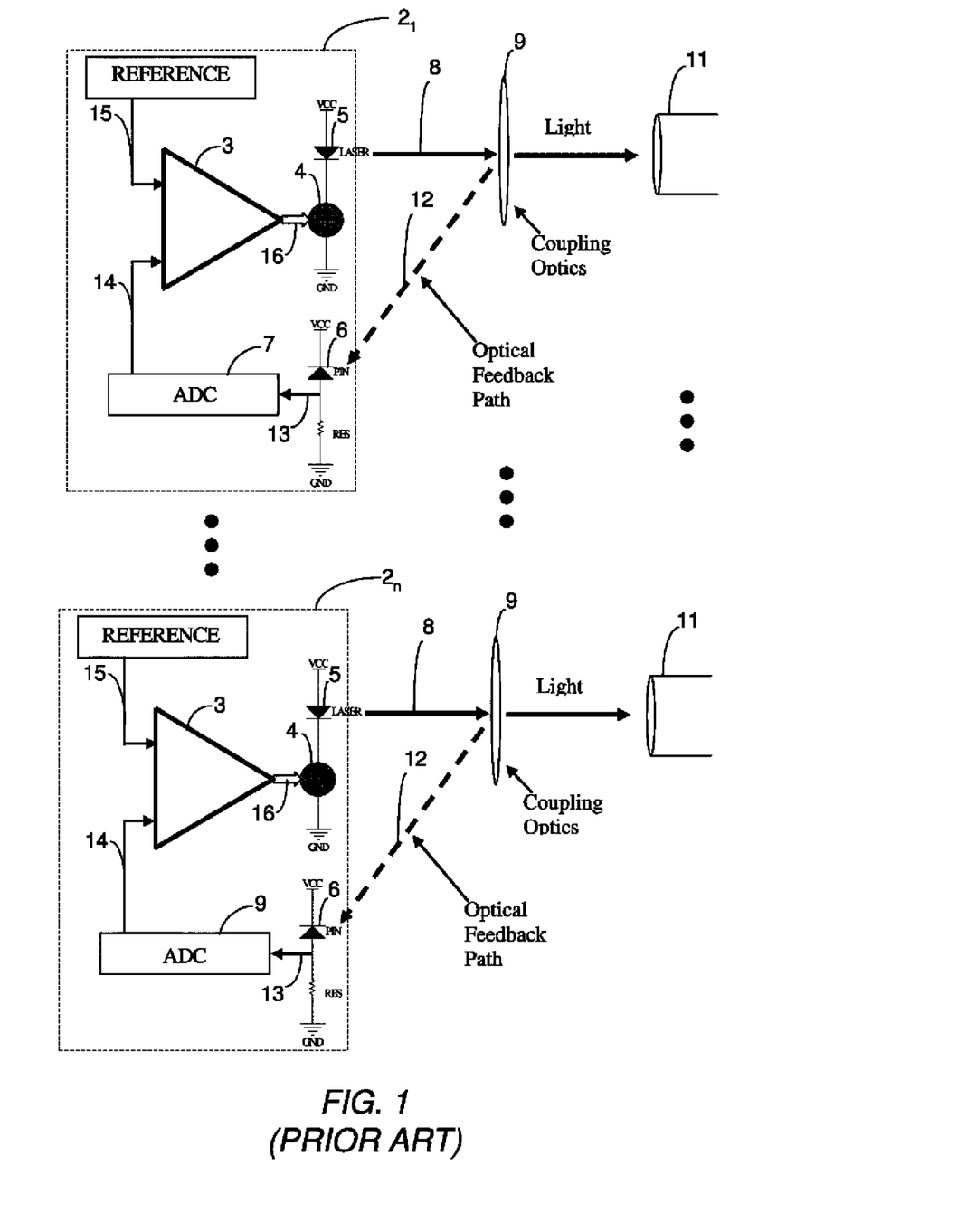
FIG. 1 illustrates a block diagram of a typical configuration of an optical output power feedback monitoring system of a known parallel optical transmitter or transceiver.

FIG. 1 illustrates a block diagram of a typical configuration of an optical output power feedback monitoring system of a known parallel optical transmitter or transceiver. The feedback monitoring system includes n feedback control loops $2_1$-$2_n$, where n is the number of optical transmit channels in the optical transmitter or transceiver. The feedback control loops $2_1$-$2_n$ are identical in configuration. The manner in which the optical output power feedback monitoring system operates will be described with reference to feedback control loop $2_1$. The feedback control loop $2_1$ includes a laser diode driver circuit 3, a current source 4, a laser diode 5, a monitor photodiode 6, and an analog-to-digital converter (ADC) 7. The laser diode 5 is modulated with an electrical data signal (not shown) to cause the laser diode 5 to produce an optical data signal 8. The optical data signal 8 is optically coupled via coupling optics 9 into an end of an optical fiber 11. The coupling optics 9 optically couple a small portion 12 of the optical data signal 8 onto the monitor photodiode 6.

The monitor photodiode 6 converts the portion 12 of the optical data signal 8 received into an analog electrical signal 13. The ADC 7 converts the analog electrical signal into a multi-bit digital feedback signal 14. The digital feedback signal 14 is fed back to the laser diode driver circuit 3. The control circuit 3 compares the digital feedback signal 14 to a pre-selected digital reference signal 15 and output a drive signal 16. The drive signal 16 drives the current source 4, which causes the bias current of the laser diode 5 to be varied, thereby causing the average output power level of the laser diode 5 to be maintained at a predetermined, substantially constant level.

In some cases, a single feedback control loop $2_1$ is used to monitor the output power level of one of the laser diodes 5, in which case all of the bias currents of all of the laser diodes 5 are adjusted by the same amount based on the optical feedback from one of the laser diodes 5. In other cases, each optical channel of the parallel optical transmitter or transceiver has a respective feedback control loop $2_1$, as depicted in FIG. 1.

One of the disadvantages of the optical output power level feedback monitoring systems of the type shown in FIG. 1 is that the photodiodes 6 can receive optical crosstalk in the form of portions of the laser light produced by the laser diodes 5 of one or more adjacent and non-adjacent optical channels. This optical crosstalk can result in errors in the amounts by which the bias currents of the laser diodes 5 are adjusted, which, in turn, can result in a failure to maintain the average optical output power levels of the laser diodes 5 at proper levels. This is particularly true when one or more of the laser diodes 5 is enabled or disabled. For example, if the laser diode 5 of feedback control loop $2_n$ is disabled, the photodiode 6 of feedback control loop $2_{n-1}$ will receive less light due to the absence of optical crosstalk from the laser diode 5 of feedback control loop $2_n$. As a result, the digital feedback signal 14 will have an artificially low value, which will result in the drive signal 16 being too great. Consequently, the current source 4 of feedback control loop $2_{n-1}$ will cause the optical output power level of its laser diode 5 to be increased more than necessary, which can result in degradation in link performance, eye safety issues, and other problems.

Accordingly, a need exists for a method and apparatus that enable the absence and presence of optical crosstalk to be compensated for in optical output power feedback monitoring systems used in parallel optical transmitters and receivers.

SUMMARY OF THE INVENTION

The invention provides a method and an apparatus for use in a parallel optical transmitter or transceiver to compensate for variations in optical crosstalk in an optical output power monitoring system that are caused by lasers being enabled and/or disabled. The apparatus comprises n feedback control loops, where n is the number of optical transmit channels in the parallel optical transmitter or transceiver and is equal to or greater than 2, a memory device, and a controller. Each feedback control loop has at least a laser diode driver circuit, a laser diode, coupling optics, and a photodiode. When the laser diode is biased to produce an optical signal, the coupling optics couple at least a portion of the optical signal produced by the laser diode onto the photodiode. The portion of the optical signal coupled onto the photodiode is an optical feedback signal. The photodiode converts the optical feedback signal into an electrical feedback signal, which is input to a first input terminal of the laser diode driver circuit.

The memory device has n original reference values stored therein. The controller is configured to cause, when operating in a normal mode of operations, the n original reference values to be retrieved from the memory device and applied to respective second input terminals of respective laser diode driver circuits of respective feedback control loops. Prior to causing the respective original reference values to be applied to the second input terminals of the respective laser diode driver circuits, the controller determines whether or not adjustments need to be made to the original reference values to compensate for a change in an amount of optical crosstalk present in or absent from one or more of the feedback control loops. If the controller determines that adjustments need to be made to the original reference values, the controller adjusts the original reference values to produce new reference values and causes respective new reference values to be applied to the respective second input terminals of the laser diode driver circuit.

The method comprises the following. In n feedback control loops, where n is the number of optical transmit channels in the parallel optical transmitter or transceiver, n respective laser diodes of n respective feedback control loops are enabled. Each laser diode is driven by a respective laser diode driver circuit of the respective feedback control loop, and each laser diode driver circuit has at least first and second input terminals. The first input terminal receives an electrical feedback signal that is based on an optical output power level of the respective laser diode detected by a respective photodiode of the respective feedback control loop. The respective reference values are applied to respective second input terminals of respective laser diode driver circuits. In a controller of the parallel optical transmitter or transceiver, a determination is made as to whether or not adjustments need to be made to the original reference values to compensate for a change in an amount of optical crosstalk present in or absent from one or more of the feedback control loops. If the controller determines that adjustments need to be made, the controller adjusts the original reference values to produce new reference values and causes respective new reference values to be applied to the respective second terminals of the laser diode driver circuit.

These and other features and advantages of the invention will become apparent from the following description, drawings and claims.

DETAILED DESCRIPTION OF AN ILLUSTRATIVE EMBODIMENT

In accordance with embodiments of the invention, a method and an apparatus are provided for use in a parallel optical transmitter or transceiver to compensate for variations in optical crosstalk in an optical output power monitoring system that are caused by lasers being enabled and/or disabled. In particular, the method and apparatus cause adjustments to be made to the reference value of each optical channel based on determinations of whether one or more lasers of the other optical channels have been disabled or enabled. By making these adjustments, the average optical output power level of each laser of each channel can be maintained at a desired or required level even if one or more of the lasers of one or more of the other channels is enabled or disabled.

Figure 2:
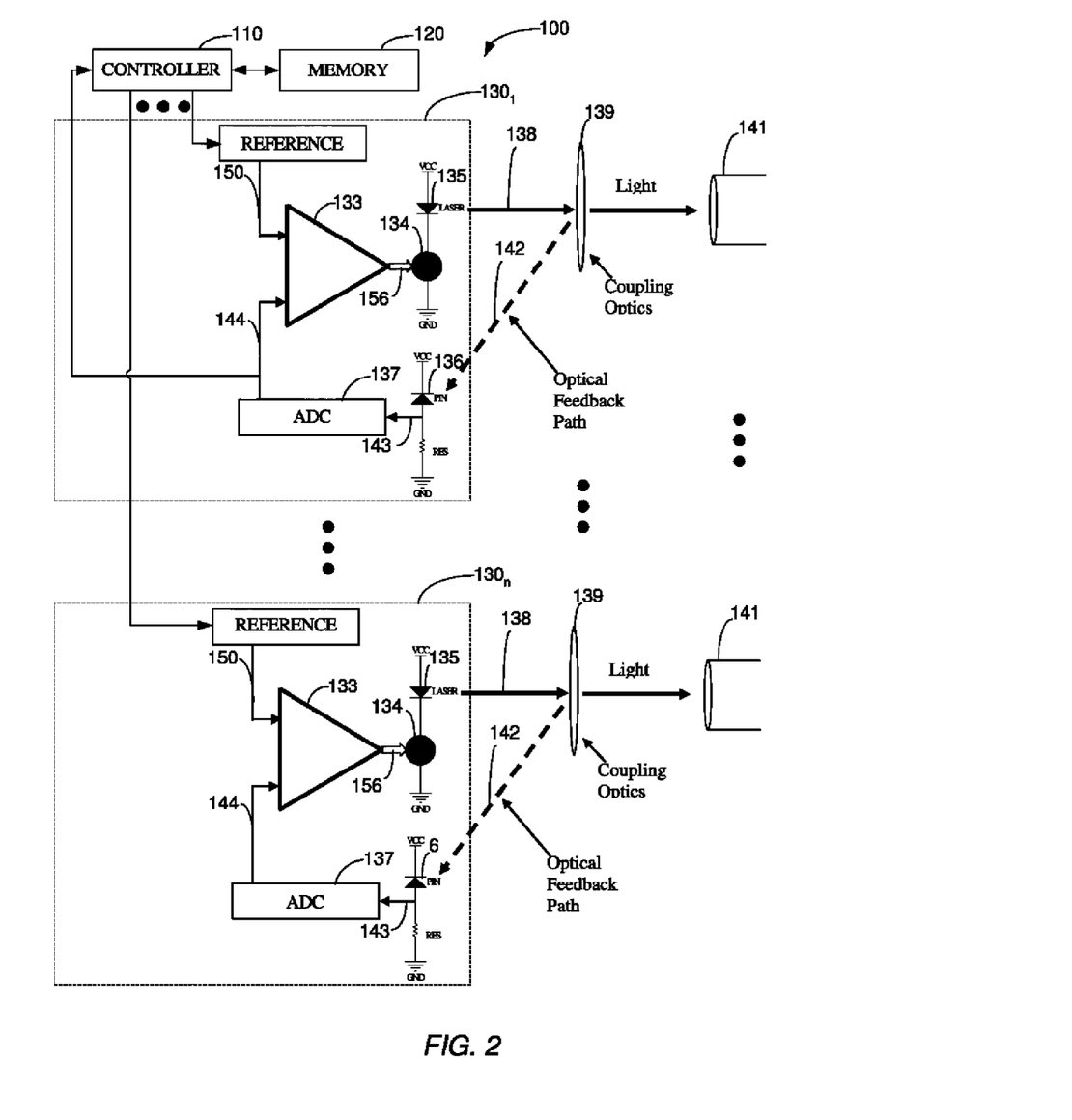
FIG. 2 illustrates a block diagram of the apparatus in accordance with an embodiment for monitoring and controlling the optical output power of laser diodes of a parallel optical transmitter or transceiver that employs the apparatus.

FIG. 2 illustrates a block diagram of the apparatus 100 in accordance with an embodiment. The apparatus 100 is an optical output power feedback monitoring system for use in a parallel optical transmitter or transceiver. The apparatus includes a controller 110, a memory device 120, and n feedback control loops $130_1$-$130_n$, where n is the number of optical transmit channels in the optical transmitter or transceiver. The feedback control loops $130_1$-$130_n$ are identical in configuration. Therefore, in the interest of brevity, the manner in which the apparatus 100 operates during a normal mode of operations will be described with reference to feedback control loop $130_1$ and with reference to the controller 110 and memory device 120.

The feedback control loop $130_1$ includes a laser diode driver circuit 133, a current source 134, a laser diode 135, a monitor photodiode 136, and an ADC 137. The laser diode 135 is modulated with an electrical data signal (not shown) to cause the laser diode 135 to produce an optical data signal 138. The optical data signal 138 is optically coupled via coupling optics 139 into an end of an optical fiber 141. The coupling optics 139 optical couple a small portion 142 of the optical data signal 138 onto the monitor photodiode 136. The small portion 142 of the optical data signal 138 is the optical feedback that will be used to adjust the bias current of the laser diode 135.

The monitor photodiode 136 converts the portion 142 of the optical data signal 138 received into an analog electrical signal 143. The ADC 137 converts the analog electrical signal into a multi-bit digital value 144. The digital value 144 is fed back to the closed-loop control circuit 133. The laser diode driver circuit 133 compares the digital value 144 to a preselected digital reference value 150 and outputs a drive signal 156. The drive signal 156 drives the current source 134, which causes the bias current of the laser diode 135 to be varied, thereby causing the average output power level of the laser diode 135 to be maintained at a predetermined, substantially constant level.

Figure 3:
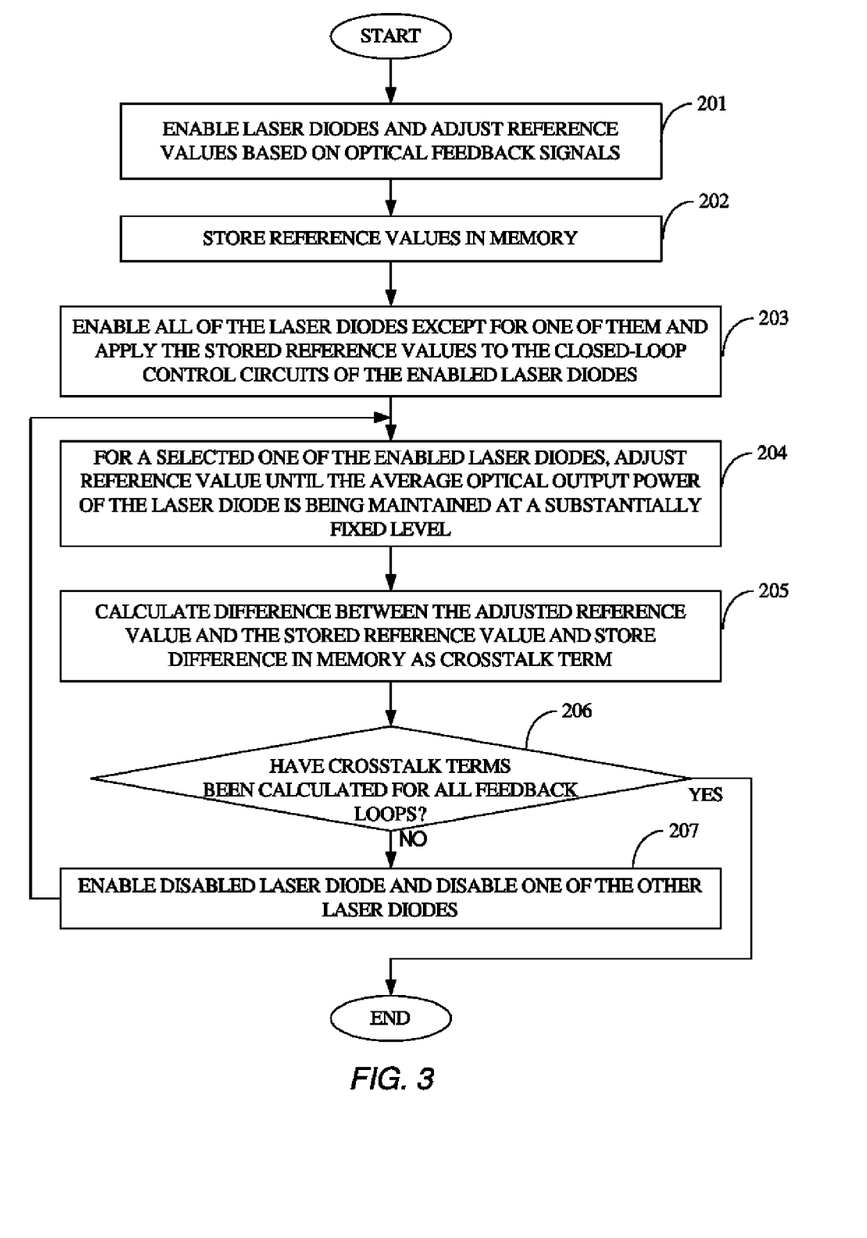
FIG. 3 illustrates a flowchart that represents the method in accordance with an embodiment for calibrating the apparatus shown in FIG. 2.

FIG. 3 illustrates a flowchart that represents a calibration process that is performed by the apparatus 100 prior to the apparatus 100 performing the above-described normal mode of operations. An embodiment of the calibration process will now be described with reference to FIG. 3. During a first calibration stage of operations, the parallel optical transmitter or transceiver is powered on and the feedback control loops $130_1$-$130_n$ operate in the normal manner described above to adjust the bias currents of the laser diodes 135 based on the optical feedback signals 142. This step is represented in FIG. 3 by block 201. During this calibration stage, all of the laser diodes 135 are enabled and each of the reference values 150 is adjusted until the controller 110 determines that the average optical output power level of the laser diode 135 is being maintained at a substantially fixed level. The corresponding reference values are stored in the memory device 120, as indicated by block 202. Thus, for each of the n optical channels, a corresponding reference value is contained in the memory device 120.

During a second calibration stage of operations, all of the laser diodes 135 except for one of them are enabled and the reference values stored in the memory device 120 are applied to the laser diode driver circuits 133 associated with the enabled laser diodes 135. This step is represented by block 203 in FIG. 3. For a selected one of the enabled laser diodes 135, the controller 110 adjusts the corresponding reference value until the controller 110 determines that the average optical output power level of the laser diode 135 is being held at a substantially fixed level, as indicated by block 204. The controller 110 calculates the difference between the stored reference value and the adjusted reference value and stores the difference in the memory device 120 as a crosstalk term, as indicated by block 205. A determination is then made as to whether a crosstalk term has been calculated for all n of the feedback control loops $130_1$-$130_n$, as indicated by block 206. If so, the process ends. If not, the laser diode 135 that was disabled is enabled while all of the other laser diodes 135 except for a selected one of them are also enabled, as indicated by block 207. The process then returns to the step represented by block 204 and the next crosstalk term is calculated and stored in memory device 120.

Figure 4:
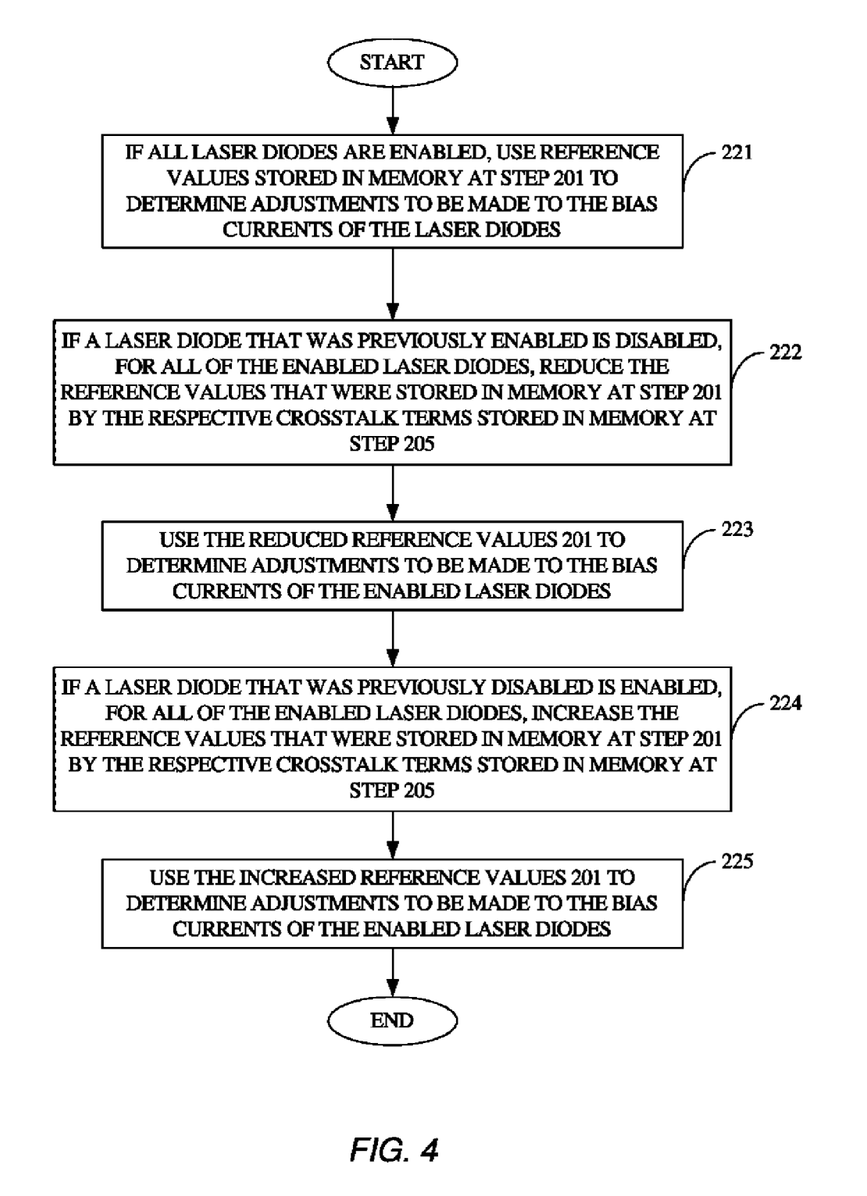
FIG. 4 illustrates a flowchart that represents the method in accordance with an embodiment for performing a normal mode of operations in the apparatus shown in FIG. 2 after the calibration process shown in FIG. 3 has been performed.

FIG. 4 illustrates a flowchart that represents the method for performing optical crosstalk compensation during the normal mode of operations using the crosstalk terms calculated during the calibration process represented by the flowchart shown in FIG. 3. Optical crosstalk compensation is performed by either increasing or decreasing the reference values 150 by their associated crosstalk terms based on determinations that one or more of the laser diodes 135 have been disabled or enabled.

As shown in block 221, if all laser diodes are enabled, the references values that are stored in memory device 120 at block 201 in FIG. 3 are used in the feedback control loops $130_1$-$130_n$ to determine any adjustments that are to be made to the bias currents of the laser diodes 135. As shown in block 222, if a laser diode 135 that was previously enabled is disabled, then for all of the enabled laser diodes 135, the corresponding reference values that were stored in memory device 120 at block 201 are adjusted by reducing them by the respective crosstalk terms that were stored in memory device 120 at the block 205. As shown in block 223, the reduced reference values are then used in whichever of the feedback control loops $130_1$-$130_n$ are enabled to determine any adjustments that are to be made to the bias currents of the laser diodes 135 of the enabled loops. As shown in block 224, if a laser diode 135 that was previously disabled is enabled, then for all of the enabled laser diodes 135, the corresponding reference values that were stored in memory device 120 at block 201 are adjusted by increasing them by the respective crosstalk terms that were stored in memory device 120 at the block 205. As shown in block 225, the increased reference values are then used in whichever of the feedback control loops $130_1$-$130_n$ are enabled to determine any adjustments that are to be made to the bias currents of the laser diodes 135 of the enabled loops.

The strength of the optical crosstalk depends to a large extent on the strength of the optical feedback signal (dashed lines 142 in FIG. 2). Depending on the strength of the optical crosstalk, considering only crosstalk from nearest-neighbor optical channels when performing optical crosstalk compensation may not be sufficient. Therefore, it will typically be desirable to consider optical crosstalk contributions from nearest-neighbor channels and from non-nearest-neighbor channels (e.g., two and three channels over). For example, assuming there are twelve optical transmit channels in the parallel optical transmitter or transceiver (i.e., n=12), when compensating for optical crosstalk in the feedback control loop $130_4$ (the victim channel), optical crosstalk from feedback control loops $130_3$ and $130_5$ (nearest-neighbor channels) as well as optical crosstalk from feedback control loops $130_1$, $130_2$, $130_6$ and $130_7$ (non-nearest-neighbor channels two and three over from victim channel) will be taken into account. Therefore, the calculation of the optical crosstalk terms during the above-described calibration process is performed in such a way as to take into account optical crosstalk from nearest-neighbor optical channels as well as optical crosstalk from non-nearest neighbor optical channels.

Figure 5:
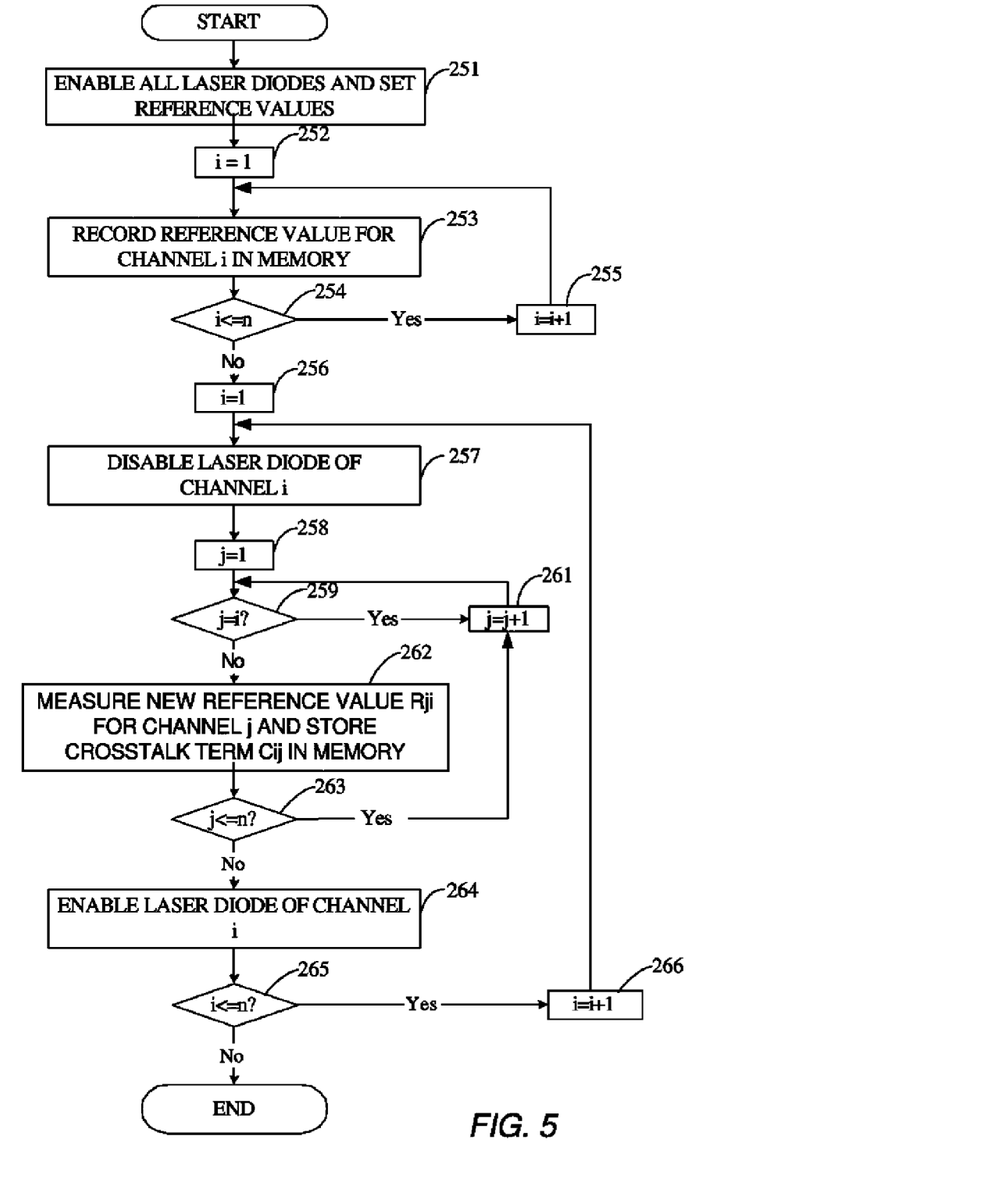
FIG. 5 illustrates a flowchart that represents the method in accordance with another embodiment for calibrating the apparatus shown in FIG. 2.

FIG. 5 illustrates a flowchart that represents a more detailed description of the calibration process described above with reference to FIG. 3, which demonstrates in more detail the manner in which the calculation of the optical crosstalk terms takes into account optical crosstalk contributed by nearest-neighbor optical channels and non-nearest-neighbor optical channels. At the start of the calibration, all of the laser diodes 135 are enabled and each of the reference values 150 is adjusted until the controller 110 determines that the average optical output power level of each of the laser diodes 135 is being maintained at a substantially fixed level. This step is represented by block 251. A variable, i, is initialized to i=1, as indicated by block 252. The value of i ranges from 1 to n, where, as stated above, n is the number of optical transmit channels in the parallel optical transmitter or receiver. The reference value, for the laser diode 135 of optical channel i is stored in the memory device 120 at a corresponding memory location associated with optical channel i, as indicated by block 253.

At block 254, a determination is made as to whether or not the value of i is less than or equal to n. If so, the process proceeds to block 255 where the value of i is incremented to i=i+1. The process then returns to block 253 where the reference value for optical channel i is stored in the memory device 120 at a corresponding memory location associated with optical channel i. The loop comprising blocks 253-255 is iterated until a reference value, for all of the n optical channels has been stored at a corresponding memory location in memory device 120. If the decision made at block 254 is answered in the negative, the process proceeds to block 256, where the value of i is again set equal to 1.

The process then proceeds to block 257, at which the laser diode 135 for channel i is disabled. A variable j is then initialized to 1, as indicated by block 258. The value of j ranges from 1 to n. A determination is then made at block 259 as to whether j is equal to i. At this point in the process, j is equal to i, and so the process proceeds to block 261, at which the value of j is incremented to j=j+1. The process then returns to block 259 and a determination is made as to whether j=1. At this point in the process, j is not equal to 1, and so the process proceeds to block 262. At block 262, the new reference value, $R_{ij}$, for optical channel j resulting from the laser diode 135 of optical channel i being disabled is measured and an optical crosstalk term, $C_{ij}$, equal to the difference between $R_j$–$R_{ij}$ is stored at a corresponding memory location in memory device 120. A determination is then made at block 263 as to whether the value of j is equal to or less than n. If not, the process proceeds to block 261 where the value of j is incremented by 1. The process then returns to block 259. Thus, as long as the value of j is greater than n, the new reference values for the laser diodes of channels other than channel i and the corresponding crosstalk terms continue to be calculated and stored in memory device 120.

If the decision that is made at block 263 is answered in the negative, then the process will proceed to block 264, at which the laser diode 135 of optical channel i is enabled. When the laser diode 135 of channel i is enabled, the reference value $R_i$ stored in memory at block 253 will be used to determine any adjustments to the bias current of the laser diode 135 for channel i. A determination is then made at block 265 as to whether the current value of i is less than or equal to n. If not, the calibration process ends because all of the reference values and crosstalk terms for all of the channels have been calculated and recorded in memory device 120. If the decision made at block 265 is answered in the affirmative, the process proceeds to block 266, at which the value if i is incremented by 1. The process then returns to block 257, at which the laser diode 135 for channel i is disabled. The loop represented by blocks 257-266 iterates until each of the laser diodes has been individually disabled and the corresponding crosstalk terms $C_{ij}$ have been calculated and stored at a corresponding location in memory device 120.

Figure 6:
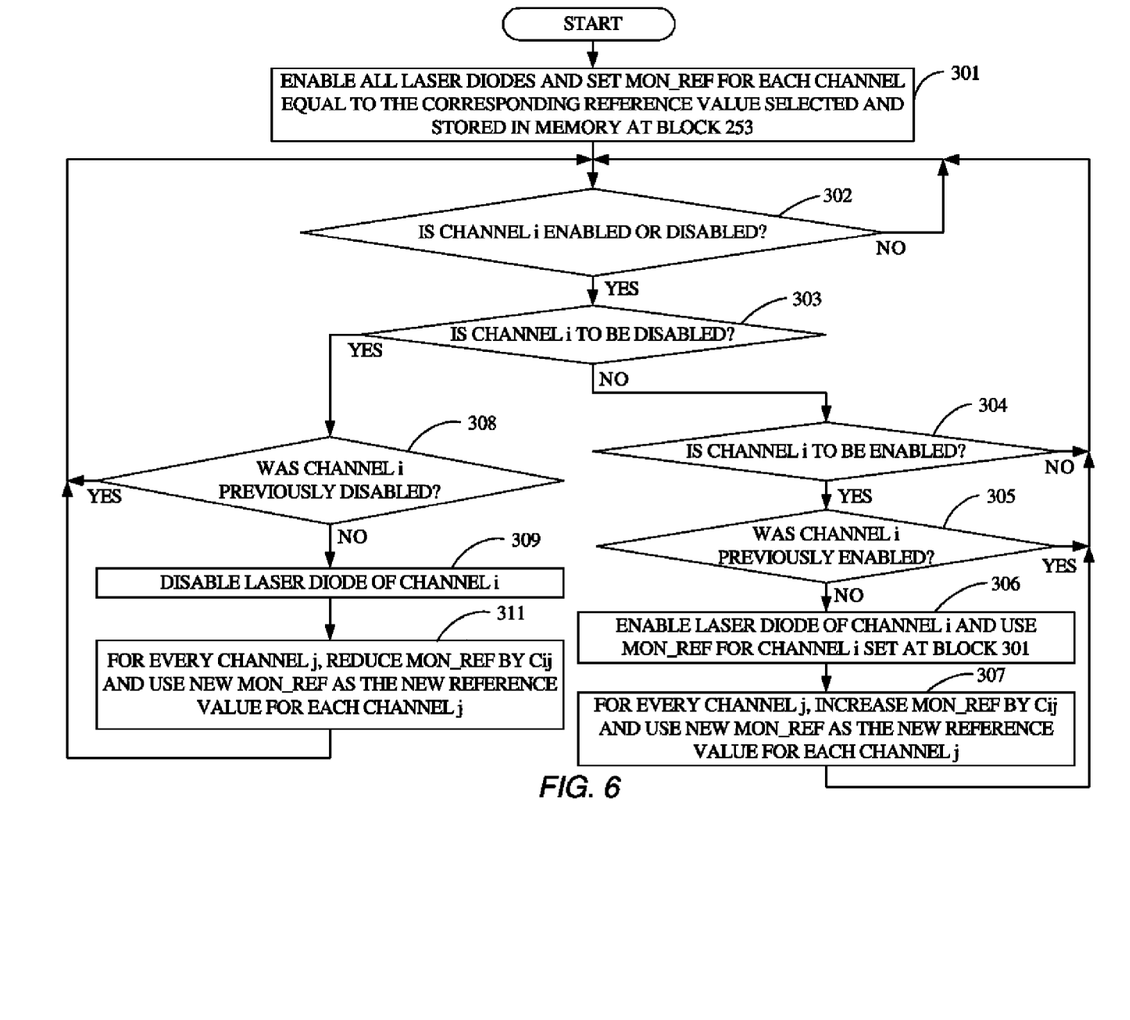
FIG. 6 illustrates a flowchart that represents the method in accordance with another embodiment for performing a normal mode of operations in the apparatus shown in FIG. 2 after the calibration process shown in FIG. 5 has been performed.

FIG. 6 illustrates a flowchart that provides a more detailed description of the normal mode of operations, which demonstrates in more detail the manner in which the crosstalk compensation takes into account optical crosstalk contributed by nearest-neighbor optical channels and non-nearest-neighbor optical channels. After the calibration process described above with reference to FIG. 5 has been performed, all of the laser diodes 135 are enabled and the reference values are set to values stored in memory at block 253 in FIG. 5. As indicated above, these reference values are values that cause the laser diode driver circuits 133 to maintain the average optical output power levels of the laser diodes 135 at substantially constant levels, as indicated by block 301. A set of parameters, $MON\_REF_1$-$MON\_REF_n$, are used to represent the reference values for optical transmit channels $130_1$-$130_n$ (FIG. 2), respectively.

At block 302, a determination is made as to whether the laser diode 135 of optical channel i is to be disabled or enabled, where i ranges from 1 to n and is not equal to j. If the determination of block 302 is answered in the negative, the determination of block 302 is repeated. If a determination is made at block 302 that the laser diode 135 of optical channel i is to be enabled or disabled, then a decision is made at block 303 as to whether or not the laser diode 135 of channel i is to be disabled. If not, then a determination is made at block 304 as to whether or not the laser diode 135 of channel i is to be enabled. If not, the process returns to block 302. If so, then a determination is made at block 305 as to whether or not channel i was previously enabled. If so, then the process returns to block 302. If not, the process proceeds to block 306, at which the reference value that is used for optical transmit channel i is set equal to $MON\_REF_i$. The process then proceeds to block 307, at which the reference values $MON\_REF_j$ for the optical transmit channels j are increased by the crosstalk terms, respectively, where j ranges from 1 to n and j is not equal to i.

If at block 303, the determination is answered in the affirmative, the process proceeds to block 308, at which a determination is made as to whether or not channel i was previously disabled. If so, the process returns to block 302. If not, the process proceeds to block 309, at which the laser diode 135 of optical transmit channel i is disabled. The process then proceeds to block 311, at which the reference values $MON\_REF_j$ for the optical transmit channels j are decreased by the crosstalk terms $C_{ij}$, respectively.

It should be noted that the processes described above with reference to FIGS. 3-6 are examples of possible implementations of the methods of the invention. A variety of modifications can be made to the processes described with reference to FIGS. 3-6 without deviating from the invention. For example, the order of the steps represented by the blocks in these figures can in some cases be changed, and some of the steps represented by the blocks can be combined or eliminated altogether. Persons of ordinary skill in the art will understand the manner in which the processes represented by these flowcharts can be modified and that all such modifications are within the scope of the invention. For example, with reference to FIG. 5, blocks 251 and 252 may be reversed. It should also be noted that the apparatus of the invention is not limited to the configuration shown in FIG. 2. For example, although each of the feedback control loops $130_1$-$130_n$ is shown as having its own ADC 137, a single ADC that is shared by the feedback control loops $130_1$-$130_n$ may be used for this purpose. As another example, it is not necessary for each optical transmit channel to have its own feedback control loop $130_1$-$130_n$.

The processes described above with reference to FIGS. 3-6 are performed by the controller 110. The controller 110 may be the main controller of the transmitter or transceiver in which the apparatus 100 is employed or it may be a separate controller device used specifically for monitoring and controlling the optical output power levels of the laser diodes 135. The controller 110 may be any type of computational device capable of performing the processing tasks described above with reference to FIGS. 2-6. For example, the controller 110 may be a microprocessor, a microcontroller, an application specific integrated circuit (ASIC), a programmable logic array (PLA), a programmable gate array (PGA), a state machine, etc. The algorithms of the invention may be performed in hardware, software, firmware, or a combination thereof. If part or all of the algorithms are performed in software or firmware, the corresponding computer code will typically be stored in one or more computer-readable medium devices, such as memory device 120, which may be integrated together with the controller 110 in a single IC or which may be implemented in a separate IC. The computer-readable medium need not be a solid state memory device, but may be any type of memory element that is suitable for the purpose for which it is used. Suitable memory devices include random access memory (RAM), read-only memory (ROM), programmable read-only memory (PROM), erasable PROM (EPROM), magnetic disks, magnetic tape, flash memory, etc. If all or a part of the algorithms are performed in hardware in the controller 110, the hardware may be implemented in the form of one or more state machines, for example.

It should be noted that the invention has been described with reference to a few illustrative embodiments for the purposes of demonstrating the principles and concepts of the invention and to provide a few examples of the manner in which the invention may be implemented. The invention is not limited to these embodiments, as will be understood by persons skilled in the art in view of the description provided herein. Those skilled in the art will understand that modifications may be made to the embodiments described herein and that all such modifications are within the scope of the invention.

What is claimed is:

1. An apparatus for compensating for optical crosstalk in an optical output power feedback monitoring system of a parallel optical transmitter or transceiver, the apparatus comprising:

n feedback control loops, where n is a number of optical transmit channels in the parallel optical transmitter or transceiver and is equal to or greater than 2, each feedback control loop having at least a laser diode driver circuit, a laser diode, coupling optics, and a photodiode, wherein the laser diode is modulated to produce an optical signal and wherein the coupling optics couple at least a portion of the optical signal produced by the laser diode onto the photodiode, the portion of the optical signal coupled onto the photodiode being an optical feedback signal, wherein the photodiode converts the optical feedback signal into an electrical feedback signal, the electrical feedback signal being input to a first terminal of the laser diode driver circuit;

a memory device having n original reference values stored therein; and a controller configured to cause, when operating in a normal mode of operations, the n original reference values to be retrieved from the memory device and applied to respective second terminals of respective laser diode driver circuits of respective feedback control loops, wherein prior to causing the respective original reference values to be applied to the second terminals of the respective laser diode driver circuits, the controller determines whether or not adjustments need to be made to the original reference values to compensate for a change in an amount of optical crosstalk present in or absent from one or more of the feedback control loops, and wherein if the controller determines that adjustments need to be made, the controller adjusts the original reference values to produce new reference values and causes respective new reference values to be applied to the respective second terminals of the laser diode driver circuit.

2. The apparatus of claim 1, wherein the optical crosstalk corresponds to portions of the optical feedback signals that propagate out of one or more of the feedback control loops onto the photodiodes of one or more others of the feedback control loops.

3. The apparatus of claim 1, wherein the controller determines whether or not adjustments need to be made to the original reference values based on determinations by the controller as to whether one or more of the laser diodes have been enabled or disabled.

4. The apparatus of claim 3, wherein the controller determines whether or not adjustments need to be made to the original reference values retrieved from the memory device based on determinations by the controller as to whether one or more of the laser diodes have been enabled after previously having been disabled and based on determinations by the controller as to whether one or more of the laser diodes have been disabled after previously having been enabled.

5. The apparatus of claim 4, wherein if the controller determines that one or more of the laser diodes have been enabled after previously having been disabled, the controller obtains the new reference values by increasing the original references values.

6. The apparatus of claim 5, wherein if the controller determines that one or more of the laser diodes have been disabled after previously having been enabled, the controller obtains the new reference values by decreasing the original references values.

7. The apparatus of claim 1, wherein prior to the controller operating in the normal mode of operations, the controller performs a calibration process during which the original reference values are calculated and stored in the memory device, and during which respective crosstalk terms are calculated and stored in the memory device, each crosstalk term being equal to a difference between a respective original reference value and a respective new reference value.

8. The apparatus of claim 7, wherein the controller adjusts the original reference values to obtain the new reference values by either adding or subtracting the respective crosstalk term from the respective original reference value to obtain the respective new reference value.

9. An apparatus for performing optical crosstalk calibration in a parallel optical transmitter or transceiver to obtain reference values to be used in monitoring and controlling optical output power levels of laser diodes of the parallel optical transmitter or transceiver, the apparatus comprising:

a memory device; and a controller configured to perform a calibration process, the calibration process comprising:

enabling n of the laser diodes and adjusting respective initial reference values applied to the respective second terminals of the respective laser diode driver circuits until average optical output power levels of the laser diodes are being maintained at substantially constant levels, wherein n is equal to or greater than 2;

storing the adjusted initial reference values as respective original reference values in the memory device;

enabling j of the laser diodes, where j is a positive integer that ranges in value from 1 to n;

disabling an $i^{th}$ one of the laser diodes, where i is a positive integer that ranges in value from 1 to n, and where i is not equal to j;

applying respective original reference values stored in the memory device to respective second terminals of respective laser diode driver circuits of respective feedback control loops of the parallel optical transmitter or transceiver;

adjusting the respective original reference values being applied to the respective second terminals of the respective laser diode driver circuits until average optical output power levels of the respective laser diodes are being maintained at substantially constant levels, the respective adjusted original reference values corresponding to respective new reference values; and storing respective difference values in the memory device as respective optical crosstalk terms, the respective optical crosstalk terms corresponding to respective differences between respective adjusted original reference values and respective original reference values.

10. A method for compensating for optical crosstalk in an optical output power feedback monitoring system of a parallel optical transmitter or transceiver, the method comprising:

in n feedback control loops, where n is a number of optical transmit channels in the parallel optical transmitter or transceiver and is greater than or equal to 2, enabling n respective laser diodes of respective feedback control loops, each laser diode being driven by a respective laser diode driver circuit of the respective feedback control loop, each laser diode driver circuit having at least first and second input terminals, the first input terminal receiving an electrical feedback signal that is based on an optical output power level of the respective laser diode detected by a respective photodiode of the respective feedback control loop;

applying respective original reference values to respective second input terminals of respective laser diode driver circuits;

in a controller of the parallel optical transmitter or transceiver, determining whether or not adjustments need to be made to the original reference values to compensate for a change in an amount of optical crosstalk present in or absent from one or more of the feedback control loops; and if the controller determines that adjustments need to be made, the controller adjusts the original reference values to produce new reference values and causes respective new reference values to be applied to the respective second terminals of the laser diode driver circuit.

11. The method of claim 10, wherein the optical crosstalk corresponds to portions of the optical feedback signals that propagate out of one or more of the feedback control loops onto the photodiodes of one or more others of the feedback control loops.

12. The method of claim 10, wherein the controller determines whether or not adjustments need to be made to the original reference values based on determinations by the controller as to whether one or more of the laser diodes have been enabled or disabled.

13. The method of claim 12, wherein the controller determines whether or not adjustments need to be made to the original reference values retrieved from the memory device based on determinations by the controller as to whether one or more of the laser diodes have been enabled after previously having been disabled and based on determinations by the controller as to whether one or more of the laser diodes have been disabled after previously having been enabled.

14. The method of claim 13, wherein if the controller determines that one or more of the laser diodes have been enabled after previously having been disabled, the controller obtains the new reference values by increasing the original references values.

15. The method of claim 14, wherein if the controller determines that one or more of the laser diodes have been disabled after previously having been enabled, the controller obtains the new reference values by decreasing the original references values.

16. The method of claim 10, further comprising:
prior to the controller operating in the normal mode of operations, in the controller, performing a calibration process during which the original reference values are calculated and stored in the memory device, and during which respective crosstalk terms are calculated and stored in the memory device, each crosstalk term being equal to a difference between a respective original reference value and a respective new reference value.

17. The method of claim 16, wherein the controller adjusts the original reference values to obtain the new reference values by either adding or subtracting the respective crosstalk term from the respective original reference value to obtain the respective new reference value.

18. The method of claim 17, wherein if the controller determines that a laser diode that was previously enabled is to be, or has been, disabled, the controller adjusts the original reference values to obtain the new reference values by subtracting the respective crosstalk term from the respective original reference value.

19. The method of claim 17, wherein if the controller determines that a laser diode that was previously disabled is to be, or has been, enabled, the controller adjusts the original reference values to obtain the new reference values by adding the respective crosstalk term from the respective original reference value.

* * * * *